(12) United States Patent
Hansen et al.

(10) Patent No.: US 12,387,739 B2
(45) Date of Patent: Aug. 12, 2025

(54) LOUDSPEAKER SYSTEM PROVIDED WITH DYNAMIC SPEECH EQUALIZATION

(71) Applicant: EPOS Group A/S, Ballerup (DK)

(72) Inventors: Anders Røser Hansen, Ballerup (DK); Poul Peder Hestbek, Ballerup (DK); Svend Feldt, Ballerup (DK); Casper Fynsk, Ballerup (DK)

(73) Assignee: EPOS GROUP A/S, Ballerup (DK)

( * ) Notice: Subject to any disclaimer, the term of this patent is extended or adjusted under 35 U.S.C. 154(b) by 0 days.

(21) Appl. No.: 18/107,195

(22) Filed: Feb. 8, 2023

(65) Prior Publication Data

US 2023/0186931 A1 Jun. 15, 2023

Related U.S. Application Data

(63) Continuation of application No. 17/380,742, filed on Jul. 20, 2021, now Pat. No. 11,600,285.

(30) Foreign Application Priority Data

Jul. 21, 2020 (EP) .................................. 20186923

(51) Int. Cl.
*G10L 21/0208* (2013.01)
*H04R 3/00* (2006.01)
(Continued)

(52) U.S. Cl.
CPC .......... *G10L 21/0208* (2013.01); *H04R 3/005* (2013.01); *H04R 3/04* (2013.01);
(Continued)

(58) Field of Classification Search
CPC ........ G10L 21/0208; H04R 3/005; H04R 3/04; H04R 3/12; H04R 5/04; H04S 1/002; H04S 7/307
See application file for complete search history.

(56) References Cited

U.S. PATENT DOCUMENTS 6,240,192 B1 * 5/2001 Brennan .............. H04R 25/505
381/314
6,377,918 B1 * 4/2002 Series ..................... G10L 15/20
704/E15.01
(Continued)

FOREIGN PATENT DOCUMENTS

EP 2 770 635 A1 8/2014
EP 2 228 902 B1 9/2017

OTHER PUBLICATIONS

Extended European Search Report for corresponding European Application No. 21186436.8, dated Nov. 25, 2021.

*Primary Examiner* — Daniel R Sellers
(74) *Attorney, Agent, or Firm* — Birch, Stewart, Kolasch & Birch, LLP

(57) ABSTRACT

A method for speech equalization, comprising the steps of receiving an input audio signal, processing said input audio signal in dependence on frequency and to providing an equalized electric audio signal according to an equalization function, wherein said equalization function comprises at least an actuator part configured to dynamically applying a compensation filter to the received input signal and dynamically applying a transparent filter to the received input signal, and further transmitting an output signal perceivable by a user as sound representative of said electric acoustic input signal or a processed version thereof.

21 Claims, 7 Drawing Sheets

(51) Int. Cl.
    *H04R 3/04*     (2006.01)
    *H04R 3/12*     (2006.01)
    *H04R 5/04*     (2006.01)
    *H04S 1/00*     (2006.01)
    *H04S 7/00*     (2006.01)

(52) U.S. Cl.
    CPC ................ *H04R 3/12* (2013.01); *H04R 5/04* (2013.01); *H04S 1/002* (2013.01); *H04S 7/307* (2013.01)

(56) References Cited

U.S. PATENT DOCUMENTS

| | | | |
|---|---|---|---|
| 8,798,289 B1 * | 8/2014 | Every | G10L 25/48 704/226 |
| 2003/0198357 A1 * | 10/2003 | Schneider | G10L 21/0208 704/E21.009 |
| 2006/0293882 A1 * | 12/2006 | Giesbrecht | G10L 21/02 704/E15.009 |
| 2008/0077399 A1 * | 3/2008 | Yoshida | G10L 21/038 704/E21.011 |
| 2009/0299742 A1 * | 12/2009 | Toman | G10L 21/0208 704/E15.039 |
| 2010/0296669 A1 | 11/2010 | Oh et al. | |
| 2011/0142247 A1 | 6/2011 | Fellers et al. | |
| 2012/0263317 A1 | 10/2012 | Shin et al. | |
| 2014/0341388 A1 | 11/2014 | Goldstein et al. | |
| 2015/0264469 A1 * | 9/2015 | Murata | G10K 11/17821 381/71.1 |
| 2017/0111737 A1 * | 4/2017 | Painter | H04R 3/04 |
| 2019/0230433 A1 * | 7/2019 | Okuda | H04R 3/00 |
| 2021/0014624 A1 * | 1/2021 | Hook | H04R 29/006 |
| 2021/0194463 A1 * | 6/2021 | Kalinichenko | H03F 3/183 |

\* cited by examiner

LOUDSPEAKER SYSTEM PROVIDED WITH DYNAMIC SPEECH EQUALIZATION

This application is a Continuation of copending application Ser. No. 17/380,742, filed on Jul. 20, 2021, which claims priority under 35 U.S.C. § 119(a) to Application No. 20186923.7, filed in Europe on Jul. 21, 2020, all of which are hereby expressly incorporated by reference into the present application.

The present disclosure relates to loudspeaker systems, e.g. such systems that work under power constraints. The disclosure relates, in particular, to a loudspeaker system comprising a loudspeaker unit, an equalization unit, and a user interface. Preferably the loudspeaker is part of, or is, a speakerphone.

Teachings of the disclosure may e.g. be useful in applications such as handsfree telephone systems, mobile telephones, teleconferencing systems (e.g. speakerphones), headphones, headsets, public address systems, gaming devices, karaoke systems, classroom amplification systems, etc.

In telecommunication the incoming speech signals often has a suboptimal frequency content. A method to improve this shortcoming dynamically during calls is proposed.

Bad microphones, dirty microphone inlets, poorly designed microphones, improperly used microphone (e.g. headset boom microphones placed below the chin, mobile phones held at a suboptimal angle, BT (Bluetooth) headsets pointing downwards instead of towards the mouth etc.), noisy surrounding, wind noise and subsequent noise reduction, impaired communication channels, narrow band channels, bad codecs etc. are all elements that can have a large or small negative impact on listening comfort and/or speech intelligibility because they introduce a non-flat filtering of the signal. Also, the talker can have a disadvantageous amplitude response, e.g. with too little mid and high frequency content when it comes to achieving the best speech intelligibility.

The result of the above described impairments can be a bad conversational experience due to misunderstandings and a higher effort required to understand what is being said.

Also, noise and disturbances in the surroundings in the receive end can also affect speech intelligibility.

In FIG. 1 the communication channel is shown with an indication of where the degradations can take place:

A concrete solution to the problem presented here is to dynamically correct the frequency response based on the frequency content of the signal.

With the above description in mind, then, an aspect of the present disclosure is to provide a method, device and system for dynamically correct the frequency response based on the frequency content of the audio input signal, which seeks to mitigate, alleviate or eliminate one or more of the above-identified deficiencies in the art and advantages singly or in combination.

According to an aspect, a method for dynamic speech equalization, comprising receiving an input signal, processing said input audio signal in dependence on frequency and providing an equalized electric audio signal according to an equalization function, wherein said equalization function comprises at least an actuator part configured to dynamically applying a first compensation filter to the received input signal, and dynamically applying a second compensation filter to the received input signal, transmitting an output signal perceivable by a user as sound representative of said electric acoustic input signal or a processed version thereof. The second compensation filter may be a transparent filter.

Speech may be distinctly characterized by e.g. modulation index, frequency response, crest factor. Communicating via bandwidth limited channels, e.g. softphones and/or voice via telephone or data, spectral information in the transmitted speech is often distorted. As will be described herein, by utilizing knowledge of "ideal" or approximations for ideal speech it is possible to at least partially correct the distorted information. One goal of such an algorithm is to increase intelligibility and/or perceived sound quality.

One version of the method and/or speakerphone as described herein comprises a speech analysis block and frequency dependent adjustment. The speech analysis block may provide information such as speech present or not. In other versions, the speech analysis block analyses incoming speech by comparing the incoming signal to known characteristics of speech, and a possibly a deviation from those known characteristics of speech. Speech may be compared using frequency spectrum of the incoming speech to one or more stored (e.g. reference) frequency spectra of speech, such as averaged or idealized spectrum of speech. The analysis may be based on analysing the spectral shape of the incoming speech. Incoming speech may be analyzed using artificial intelligence. Based on the comparison, one or more corrections, such as a set of corrections, may be established. The determined, or estimated, corrections may then be applied to the incoming speech signal so as to establish an improved, or processed, incoming speech signal.

Analysis of speech may be divided in frequency bands, such as a first analysis path being a high frequency path and a second analysis path being a low frequency path. A frequency band may divide the high frequency path and the low frequency path, this may be established as a gap between a cutoff frequency of a high frequency filter and a low frequency filter for the respective high frequency analysis path. In one instance the low frequency path may analyze signals below 500 Hz.

In an analysis block as described herein, a low pass filter may be followed by an energy estimator. This will establish an estimate of the amount of energy in the low frequency range of the incoming speech, e.g. below 500 Hz. In an analysis block as described herein, a high pass filter may be followed by an energy estimator. This part will establish an estimate of the amount of energy in the high frequency range of the incoming speech, e.g. above 2000 Hz.

A mapper block may be provided which utilizes prior knowledge from "ideal speech", or speech characteristics, to map relationship between the high and low frequency two energy estimates mentioned above to compute an estimated correction to be applied in order to improve the incoming speech signal. A simple example could be, that this relationship between the High and Low estimator shows that the incoming signal lack energy above a given frequency, such as above 2000 Hz, hence the correction could include to add corresponding energy to the signal in the upper frequency range to better match the "ideal speech" and thereby provide a corrected speech signal.

Frequency dependent adjust could be implemented in a block having two inputs, 1) incoming impaired speech, and 2) estimated corrections to increase the quality of the incoming speech. This frequency dependent adjustment block could implement an adaptive correction functionality, such as an adaptive filter, that applies the corrections received from the Speech analysis block and output the improved speech signal for further processing or presentation to the user.

An adaptive filter could be established using two filters: Filter 1 and Filter 2. These filters could have different frequency responses. The output Filter 1 and Filter 2 could be weighted and added together to form a corrected, e.g. desired, output. If for instance Filter 2 has a nearly flat response, and filter 2 have a similar response, except an added boost above a given frequency, e.g. 2000 Hz, then by weighting filter 1 higher than filter 2 it is possible to add a boost to the upper frequencies. Naturally, this boost may be adjusted by selecting different filters and by selecting appropriate weights. Hence, with two static filters in the configuration described, it is possible to control the output of the adaptive filter using a single scalar. The example above naturally scales to N filters, however adding many filters in such a structure might not be the most efficient way to achieve the needed degrees of freedom. For the application as described in present context, 2 filters often yield acceptable results.

In one aspect, the present disclosure provides a method for operating a speakerphone, wherein the speakerphone may comprise a microphone system, an output system and a communication system, where the communication system may be configured to communicate with a far-end speaker. The speakerphone may then be configured to receive a signal via the communication system. The speakerphone may then be configured to analyze the received signal to determine if the signal comprises speech. Provided the signal comprises speech, the signal may be processed by frequency dependent processing. A speech analysis block may be configured to perform the analysis for whether the signal comprises speech. The speech analysis block may comprise a low frequency processing path and a high frequency processing path. Wherein each of the low frequency processing path and high frequency processing paths comprises a respective low or high pass filter. Further each of the low and high frequency filtering paths may comprise an energy estimator configured to provide an estimate or measure of the energy in the filter from the respective low or high pass filter. The energy level estimated or measured may be provided to a mapping block configured to characterize the respective signal relative to speech, such as ideal speech, speech frequency patterns. The characterization may include one or more of: direct comparison, correlation calculation, difference calculation, scaling. The low frequency path may have a cut-off frequency of 500 Hz, such as in the range of 400 to 600 Hz. The high frequency path may have a cut-off frequency of 2000 Hz, such as in the range of 1500 to 2500 Hz.

When a speech signal is identified in the input signal, and a need for correction or improvement has been determined, the signal may undergo frequency dependent adjustment, such as adaptive frequency dependent adjustment. The frequency dependent adjustment may be achieved via at least a first filter and a second filter. The first filter may have a frequency profile different from a frequency profile of the second filter. The first filter and the second filter preferably operate in the same frequency range, such as at least substantially within the same frequency range or at least in partly overlapping frequency ranges. The output from the first filter and the output from the second filter may be combined, such as summed. The combination or summation of the first and second filter outputs may be weighted. The combined weights of the filter components may be 1. The weighting may be frequency dependent so that one frequency bin from both the first and second filter does not have the same weight distribution of a different frequency bin.

A speakerphone being configured to perform the above method is provided in the present disclosure. Such a speakerphone comprises at least a communication unit configured to receive a communication signal, a processor for processing the communication signal and an output transducer configured to provide a signal based on the processed communication signal. The speakerphone may then be configured to perform the steps mentioned in relation to the above method. The speakerphone may comprise any or all additional features as disclosed in the present disclosure.

In one aspect, said compensation filter applies compensation for a worst case impaired signal and the transparent filter applies compensations for a best case impaired signal.

In one aspect, the method comprising mixing the first output signal from said compensation filter and the second output signal from said transparent filter based on a first and second dynamic weights, respectively.

In one aspect, the method comprising continuously updating the first and second dynamic weights, respectively.

In one aspect, a speech passage of high quality will have high weight of the transparent filter output and a speech passage of low quality will have a high weight of the output from the compensation filter output and medium impaired speech passages would likely use 0.5 weights on both.

The equalization function may comprise an analysis part configured to determining the mixing weights and comprising applying a first filter to said received input signal, and/or applying a second filter to said received input signal.

The analysis part may comprise a mapping function for mixing the weights and updating said weights for each input signal.

According to another aspect, a loudspeaker system or a hearing device is provided, comprising an input unit for receiving an audio input signal with a first dynamic range of levels representative of a time and frequency variant sound signal, the electric input signal comprising a target signal and/or a noise signal and providing an electric audio input signal, a processing unit for modifying said input audio signal in dependence on frequency and for providing an equalized electric audio signal according to an equalization function. Advantageously the input unit received an audio signal from a remote source, e.g., a far-end speaker. The equalization function comprises at least an actuator part comprising a compensation filter dynamically applied to said received input signal, and a transparent filter dynamically applied to received input signal. The loudspeaker system further comprises an output unit for providing an output signal perceivable by a user as sound representative of said electric acoustic input signal or a processed version thereof.

An article of manufacture, e.g. a communication device, comprising a loudspeaker system as described above in the description, in the drawings and in the claims is furthermore provided.

The article of manufacture may implement a communication device comprising
    a first microphone signal path comprising
        a microphone unit,
        a first signal processing unit, and
        a transmitter unit
        said units being operationally connected to each other and configured to transmit a processed signal originating from an input sound picked up by the microphone, and
    a second loudspeaker signal path comprising
        a receiver unit,
        a second signal processing unit, and
        a loudspeaker unit operationally said units being operationally connected to each other and configured to provide an acoustic sound signal originating from a signal received by the receiver unit.

Thereby a speakerphone or a headset comprising a loudspeaker system according to the present disclosure can be implemented.

The communication device may comprise at least one audio interface to a switched network and at least one audio interface to an audio delivery device. The (one way) audio delivery device may be a music player or any other entertainment device providing an audio signal. The (loudspeaker system of the) communication device may be configured to enter or be in the first, full bandwidth mode, when connected via the audio interface to a (one way) audio delivery device. The (loudspeaker system of the) communication device may be configured to enter or be in the second, limited bandwidth mode, when connected via the audio interface to a communication device for establishing a (two way) connection to another communication device via a switched network. Alternatively, such changes of mod can be initiated via a user interface of the communication device.

The communication device may comprise a speakerphone or a mobile (e.g. cellular) telephone (e.g. a SmartPhone) or a headset or a hearing aid.

The article of manufacture may comprise or be a headphone or a gaming device.

The loudspeaker system may for example be used in a telephone conference, where the audio gateway may be a laptop or another type computer device, or a smartphone connected to an internet network or a telephone network via the first communication link.

In an aspect, a headset or headphone comprising a loudspeaker system as described above, in the drawings and in the claims is furthermore provided.

The loudspeaker system according to the present disclosure is in general applicable in any device or system comprising a specific electroacoustic system (e.g. including a loudspeaker and a mechanical parts in communication with the loudspeaker) with a resulting transfer function, which (at a specific sound output) exhibits a low frequency and/or high frequency drop-off (as schematically shown for a loudspeaker unit in FIG. 3c). The application of a loudspeaker system according to the present disclosure may advantageously contribute to a compensation for loss of low and/or high frequency components of the sound output to the environment (e.g. due to leakage).

In a headset or headphone, the drop-off is primarily determined by the electroacoustic system (including A. the loudspeaker design, and B. the ear-cup/ear pad/ear bud/ear piece design).

The headphone or headset may be of the open type (indicating a certain or substantial exchange of sound with the environment). The headphone or headset may be of the closed type (indicating an aim to limit the exchange of sound with the environment).

The term open may in the present context be taken to mean that a relatively high acoustic leakage between the surrounding environment and a volume limited by to the ear/ear canal/ear drum and an ear cup/ear pad/ear bud of the headset or headphone covering or blocking the ear/ear canal. In a closed type headphone or headset, the leakage will be (substantially) less than in an open type (but some leakage will typically be present; and this leakage may be compensated for by a loudspeaker system according to the present disclosure).

The headphone or headset may comprise an active noise cancellation system.

In a further aspect, use of a loudspeaker system as described above, in the drawings. Use in a speakerphone, or a mobile (e.g. cellular) telephone (e.g. a SmartPhone), or a gaming device, or a headphone, or a headset, or a hearing aid is provided.

The communication device may be portable device, e.g. a device comprising a local energy source, e.g. a battery, e.g. a rechargeable battery. The hearing assistance device may be a low-power device. The term 'low power device' is in the present context taken to mean a device whose energy budget is restricted, e.g. because it is a portable device, e.g. comprising an energy source, which—without being exchanged or recharged—is of limited duration (the limited duration being e.g. of the order of hours or days).

The communication devices may comprise an analogue-to-digital converter (ADC) to digitize an analogue input with a predefined sampling rate, e.g. 20 kHz. The communication device may comprise a digital-to-analogue converter (DAC) to convert a digital signal to an analogue output signal, e.g. for being presented to a user or users via an output transducer.

The frequency range considered by the communication device may be from a minimum frequency $f_{min}$ to a maximum frequency $f_{max}$ comprises a part of the typical human audible frequency range from 20 Hz to 20 kHz, e.g. a part of the range from 20 Hz to 12 kHz.

The communication device may comprise a voice detector (VD) for determining whether or not an input signal comprises a voice signal (at a given point in time). Such detector may aid in determining an appropriate mode of operation of the loudspeaker system. The voice detector may output a probability that voice is present or may output a binary decision whether voice is present or not.

The communication device may comprise an acoustic (and/or mechanical) feedback suppression system. The communication device may further comprise other relevant functionality for the application in question, e.g. compression, noise reduction, etc.

The communication device may comprise a cellular telephone or a speakerphone. The communication device may comprise or be a listening device, e.g. an entertainment device, e.g. a music player, e.g. a hearing aid, e.g. a hearing instrument, e.g. a headset, an earphone, an ear protection device or a combination thereof.

When the loudspeaker system are headphones, then one advantage of the present disclosure is that an audio signal comprising speech or music, or any sound, can be easily distributed between two output transducers of the communication unit located at respective ears of the user/wearer.

The audio signal being transmitted via the communication link may comprise speech from one or more users of another audio gateway connected to the other end of the first communication link, i.e. from remote, or far-end, speaker or speakers. Alternatively, or additionally, the audio signal may comprise music. In this example, the music may then be played on the communication units simultaneously.

A hearing device may be or include a hearing aid that is adapted to improve or augment the hearing capability of a user by receiving an acoustic signal from a user's surroundings, generating a corresponding audio signal, possibly modifying the audio signal and providing the possibly modified audio signal as an audible signal to at least one of the user's ears. The "hearing device" may further, or alternatively, refer to a device such as a hearable, an earphone or a headset adapted to receive an audio signal electronically, possibly modifying the audio signal and providing the possibly modified audio signals as an audible signal to at least one of the user's ears. Such audible signals may be provided in the form of an acoustic signal radiated into the user's outer ear, or an acoustic signal transferred as mechanical vibrations to the user's inner ears through bone structure of the user's head and/or through parts of middle ear of the user or electric signals transferred directly or indirectly to cochlear nerve and/or to auditory cortex of the user.

A hearing device may be adapted to be worn in any known way. This may include i) arranging a unit of the hearing device behind the ear with a tube leading air-borne acoustic signals into the ear canal or with a receiver/loudspeaker arranged close to or in the ear canal such as in a Behind-the-Ear type hearing aid, and/or ii) arranging the hearing device entirely or partly in the pinna and/or in the ear canal of the user such as in an In-the-Ear type hearing aid or In-the-Canal/Completely-in-Canal type hearing aid, or iii) arranging a unit of the hearing device attached to a fixture implanted into the skull bone such as in Bone Anchored Hearing Aid or Cochlear Implant, iv) arranging a unit of the hearing device as an entirely or partly implanted unit such as in Bone Anchored Hearing Aid or Cochlear Implant, or v) arranging an ear-cup at one or both ears of a user so that sound may be radiated into the respective ear canal of the user.

In case of implementing aspects of the present disclosure in a speakerphone, such a speaker phone would comprise a speakerphone housing, an output transducer, an input transducer and a processor.

A "hearing system" refers to a system comprising one or two hearing devices, and a "binaural hearing system" refers to a system comprising two hearing devices where the devices are adapted to cooperatively provide audible signals to both of the user's ears. The hearing system or binaural hearing system may further include auxiliary device(s) that communicates with at least one hearing device, the auxiliary device affecting the operation of the hearing devices and/or benefitting from the functioning of the hearing devices. A wired or wireless communication link between the at least one hearing device and the auxiliary device is established that allows for exchanging information (e.g. control and status signals, possibly audio signals) between the at least one hearing device and the auxiliary device. Such auxiliary devices may include at least one of remote controls, remote microphones, audio gateway devices, mobile phones, public-address systems, car audio systems or music players or a combination thereof. The audio gateway is adapted to receive a multitude of audio signals such as from an entertainment device like a TV or a music player, a telephone apparatus like a mobile telephone or a computer, a PC. The audio gateway is further adapted to select and/or combine an appropriate one of the received audio signals (or combination of signals) for transmission to the at least one hearing device. The remote control is adapted to control functionality and operation of the at least one hearing devices. The function of the remote control may be implemented in a Smartphone or other electronic device, the Smartphone/electronic device possibly running an application that controls functionality of the at least one hearing device.

In general, a hearing device includes i) an input unit such as a microphone for receiving an acoustic signal from a user's surroundings and providing a corresponding input audio signal, and/or ii) a receiving unit for electronically receiving an input audio signal.

The hearing device further includes a signal processing unit for processing the input audio signal and an output unit for providing an audible signal to the user in dependence on the processed audio signal.

The input unit may include multiple input microphones, e.g. for providing direction-dependent audio signal processing. Such directional microphone system is adapted to enhance a target acoustic source among a multitude of acoustic sources in the user's environment. In one aspect, the directional system is adapted to detect (such as adaptively detect) from which direction a particular part of the microphone signal originates. This may be achieved by using conventionally known methods. The signal processing unit may include amplifier that is adapted to apply a frequency dependent gain to the input audio signal. The signal processing unit may further be adapted to provide other relevant functionality such as compression, noise reduction, etc. The output unit may include an output transducer such as a loudspeaker/receiver for providing an air-borne acoustic signal transcutaneous or percutaneous to the skull bone or a vibrator for providing a structure-borne or liquid-borne acoustic signal. In some hearing devices, the output unit may include one or more output electrodes for providing the electric signals such as in a Cochlear Implant.

Further objects of the application are achieved as defined in the dependent claims and in the detailed description of the disclosure.

BRIEF DESCRIPTION OF DRAWINGS

The aspects of the disclosure may be best understood from the following detailed description taken in conjunction with the accompanying figures. The figures are schematic and simplified for clarity, and they just show details to improve the understanding of the claims, while other details are left out. Throughout, the same reference numerals are used for identical or corresponding parts. The individual features of each aspect may each be combined with any or all features of the other aspects. These and other aspects, features and/or technical effect will be apparent from and elucidated with reference to the illustrations described hereinafter in which:

Figure 1:
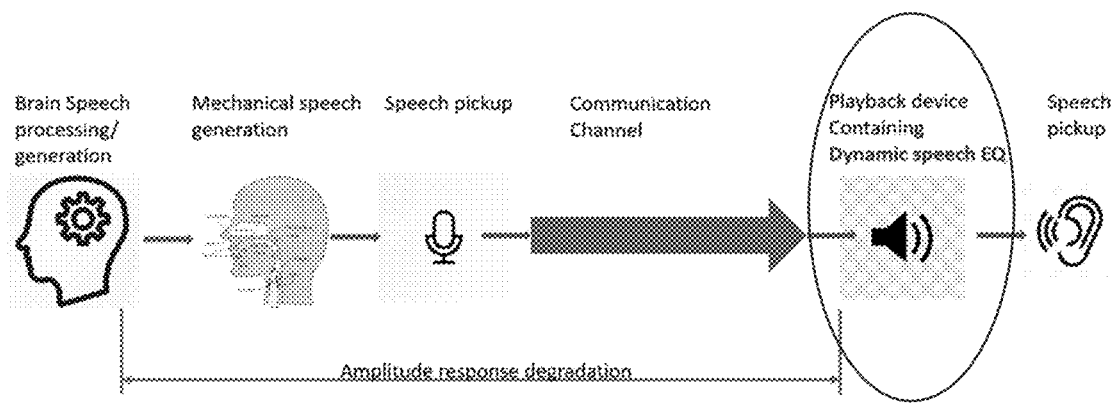
FIG. 1 shows a communication channel with amplitude response degradation.

Further scope of applicability of the present disclosure will become apparent from the detailed description given hereinafter. However, it should be understood that the detailed description and specific examples, while indicating preferred embodiments of the disclosure, are given by way of illustration only. Other embodiments may become apparent to those skilled in the art from the following detailed description.

DETAILED DESCRIPTION

The detailed description set forth below in connection with the appended drawings is intended as a description of various configurations. The detailed description includes specific details for the purpose of providing a thorough understanding of various concepts. However, it will be apparent to those skilled in the art that these concepts may be practiced without these specific details. Several aspects of the apparatus and methods are described by various blocks, functional units, modules, components, circuits, steps, processes, algorithms, etc. (collectively referred to as "elements"). Depending upon particular application, design constraints or other reasons, these elements may be implemented using electronic hardware, computer program, or any combination thereof.

The electronic hardware may include micro-electronic-mechanical systems (MEMS), integrated circuits (e.g. application specific), microprocessors, microcontrollers, digital signal processors (DSPs), field programmable gate arrays (FPGAs), programmable logic devices (PLDs), gated logic, discrete hardware circuits, printed circuit boards (PCB) (e.g. flexible PCBs), and other suitable hardware configured to perform the various functionality described throughout this disclosure, e.g. sensors, e.g. for sensing and/or registering physical properties of the environment, the device, the user, etc. Computer program shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

In general, a hearing device includes i) an input unit such as a microphone for receiving an acoustic signal from a user's surroundings and/or the user's own voice and providing a corresponding input audio signal, and/or ii) a receiving unit for electronically receiving an input audio signal. The hearing device further includes a signal processing unit for processing the input audio signal and an output unit for providing an audible signal to the user in dependence on the processed audio signal.

In telecommunication the incoming speech signals often has a suboptimal frequency content. A method to improve this shortcoming dynamically during calls is proposed.

Bad microphones, dirty microphone inlets, poorly designed microphones, improperly used microphone (e.g. headset boom microphones placed below the chin, mobile phones held at a suboptimal angle, BT headsets pointing downwards instead of towards the mouth etc.), noisy surrounding, wind noise and subsequent noise reduction, impaired communication channels, narrow band channels, bad codecs etc. are all elements that can have a large or small negative impact on listening comfort and/or speech intelligibility because they introduce a non-flat filtering of the signal.

Also, the talker can have a disadvantageous amplitude response, e.g. with too little mid and high frequency content when it comes to achieving the best speech intelligibility.

The result of the above described impairments can be a bad conversational experience due to misunderstandings and a higher effort required to understand what is being said.

Also, noise and disturbances in the surroundings in the receive end can also affect speech intelligibility.

FIG. 1 shows the communication channel with an indication of where the degradations may take place.

Figure 2:
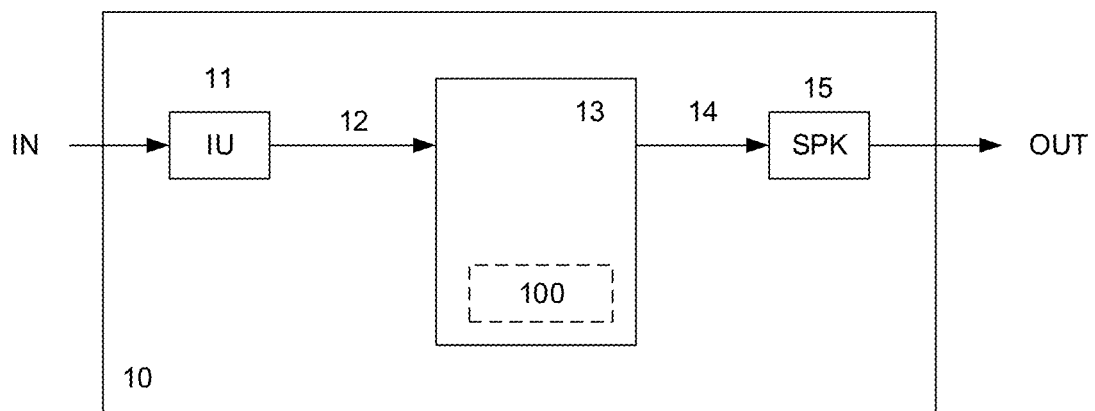
FIG. 2 shows a hearing device/loudspeaker system according to the present disclosure.

FIG. 2 shows a loudspeaker system 10 including an input unit 11, IU, providing an electric input audio signal 12, eIN, based on an input signal, IN. Input signal IN may e.g. be an acoustic signal from the environment (in which case input unit IU comprises a microphone), or an electric signal received from a component of the loudspeaker system or from another device, such as via a data communication channel or phone connection, or a mixture thereof. The input unit IU comprises an audio interface. The input signal IN may (in case it is an electric signal) be an analogue signal (e.g. an audio signal from an audio jack interface) or a digital signal (e.g. an audio signal from a USB audio interface). The input unit 11 (IU) may e.g. comprise an analogue to digital converter (ADC) to convert an analogue electric signal to a digital electric signal (using an appropriate audio sampling frequency, e.g. 20 kHz). The loudspeaker system 10 further comprises a processing unit 13 including an dynamic speech equalization function 100, EQ, for modifying the electric input audio signal 12, eIN, (or a processed version thereof) in dependence on frequency and to provide an processed electric audio signal 14, eINeq, according to a predefined dynamic speech equalization function. The dynamic speech equalization unit 100, EQ, is further described in FIGS. 3 and 4. The loudspeaker system 10 further comprises a loudspeaker unit 15, SPK, for converting the processed electric audio signal 14, eINeq, to an acoustic output sound signal OUT. The loudspeaker unit 14 may alternatively be a mechanical vibrator of a bone anchored hearing device. In a particular mode of operation of the loudspeaker system 10, the processing unit 13 is configured to apply a specific dynamic speech equalization function 100 to the electric input audio signal. The loudspeaker system 10 comprises a dynamic speech equalization unit 100 indicating a predefined frequency dependent gain w1, w2 (e.g. attenuation) to be applied to the input audio signal 12.

Figure 3:
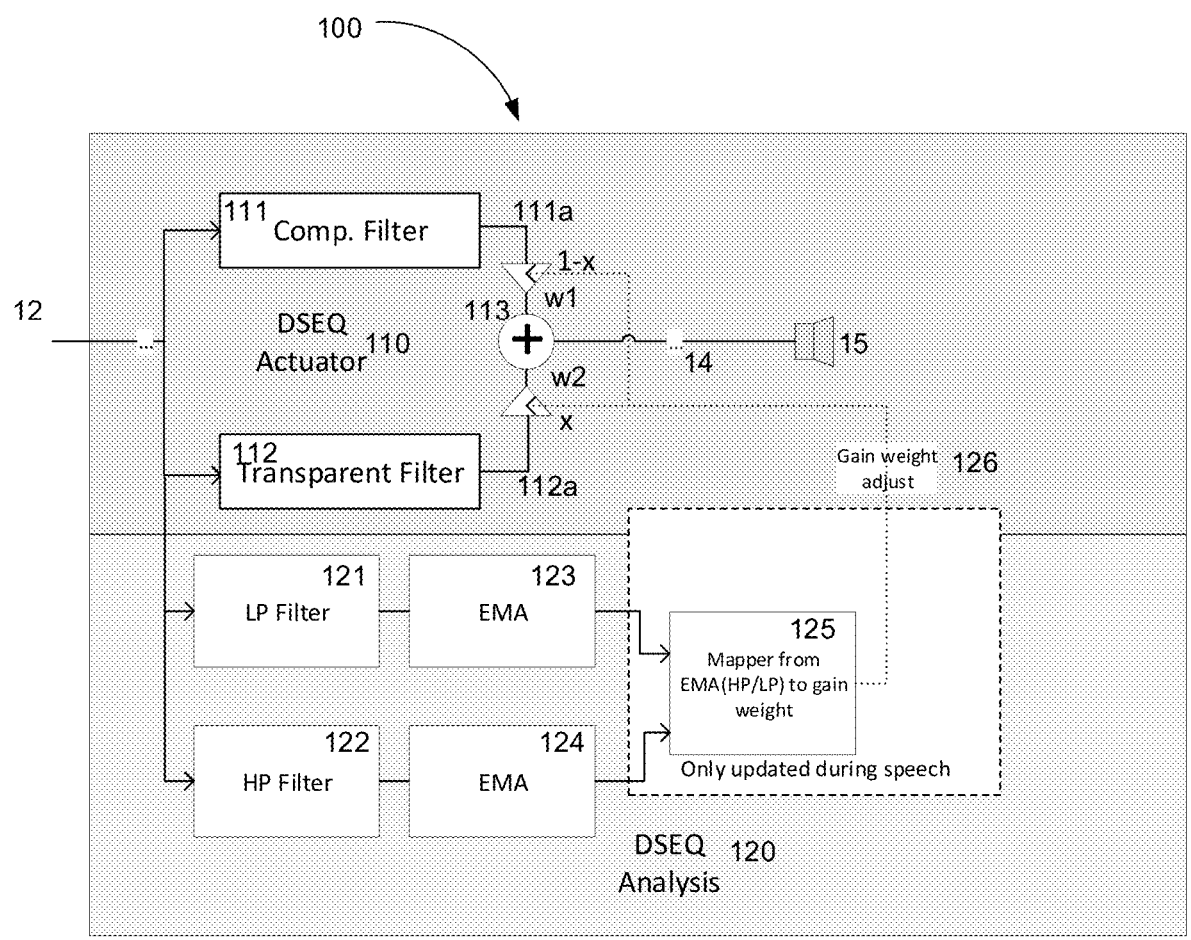
FIG. 3 shows a dynamic speech equalizer for a loudspeaker system according to the present disclosure.

FIG. 3 shows a dynamic speech equalization function 100 or algorithm which dynamically correct the frequency response based on the frequency content of the acoustic input audio signal 12. The algorithm enhances speech intelligibility by dynamically applying a compensation filter 111 to the incoming acoustic audio signal 12 when necessary and to the necessary extent.

The algorithm is divided in an actuator part 110 and an analysis part 120. In the actuator part 110 the audio input signal 12 is let through both a compensation filter 111 and a transparent filter 112. The compensation filter 111 applies compensation for a worst-case impaired signal. The output 112a of the transparent filter 112 is intended for a best-case signal. The transparent filter 112 need not necessarily be transparent. The two outputs 111a, 112a are mixed together with dynamic weights w1, w2 that are continuously updated (for each input sample) by the analysis part 120. A speech passage of high quality will have high weight of the transparent filter output 112a and a speech passage of low quality will have a high weight of the output from the compensation filter output 111a. Medium impaired speech passages would likely use 0.5 weights on both.

The audio input signal 12 is also led into an analysis part 120 that determines the mixing weights w1, w2. In the analysis part 120 the audio signal 12 is filtered by at least a first filter 121 and a second filter 122. The filters 121, 122 may be of any kind. In one example the first filter 121 is a Low Pass filter (LP) and the second filter 122 is a High Pass filter (HP). An energy estimator 123 is connected to the output of the first filter 121 to estimate the amount of energy in the low frequency range of the incoming speech, by calculating an averaged energy in the first filter 121 based, e.g., on exponential moving average (EMA) calculation. Another energy estimator 124 may be connected to the output of the second filter 122 to estimate the amount of energy in the high frequency range of the incoming speech, by calculating an averaged energy of the second filter 122 using, e.g., based on EMA calculation. The averaged energy of the second filter 122 is divided by the averaged energy of the first filter 121. The division result is also averaged and led into a mapping function 125. The mapping function outputs 126 the mixing weights w1, w2, which are updated for each input sample. It can be chosen only to call the mapping function 125 if speech is detected in the audio signal, to avoid compensating based on non-speech signals.

An algorithm as described herein is contemplated to enhance speech intelligibility by dynamically applying a compensation filter to the audio signal when necessary and to the necessary extent. The algorithm may be divided in an actuator part and an analysis part. In the actuator part the audio input may be let through both a compensation filter and a transparent filter. The compensation filter may be configured to apply compensation for a worst case impaired signal. The output of the transparent filter may be intended for a best case signal. The transparent filter need not necessarily be transparent, other profiles may be applied. The two outputs may then be mixed together with dynamic weights that are continuously updated (for each input sample) by the analysis part. A speech passage of high quality will have high weight of the transparent filter output and a speech passage of low quality will have a high weight of the output from the compensation filter output. Medium impaired speech passages would likely use 0.5 weights on both.

The audio input may be led into an analysis part that determines the mixing weights, such as continuously or intermittently and/or may be adaptable. In the analysis part the audio signal may be filtered by two filters which are here called LP and HP. The filters may in principle be of any kind. In one example they are LowPass and HighPass filters. The averaged energy of the HP filter is divided by the averaged energy of the LP filter. The division result may also be averaged and let into a mapping function. The mapping function may output the mixing weights and may be updated for each input sample, or for a period of a number of samples, e.g. for each fifth sample or the like. It may be chosen only to enable the mapping function provided speech is detected in the audio signal, which help avoid compensating based on non-speech signals.

Figure 4:
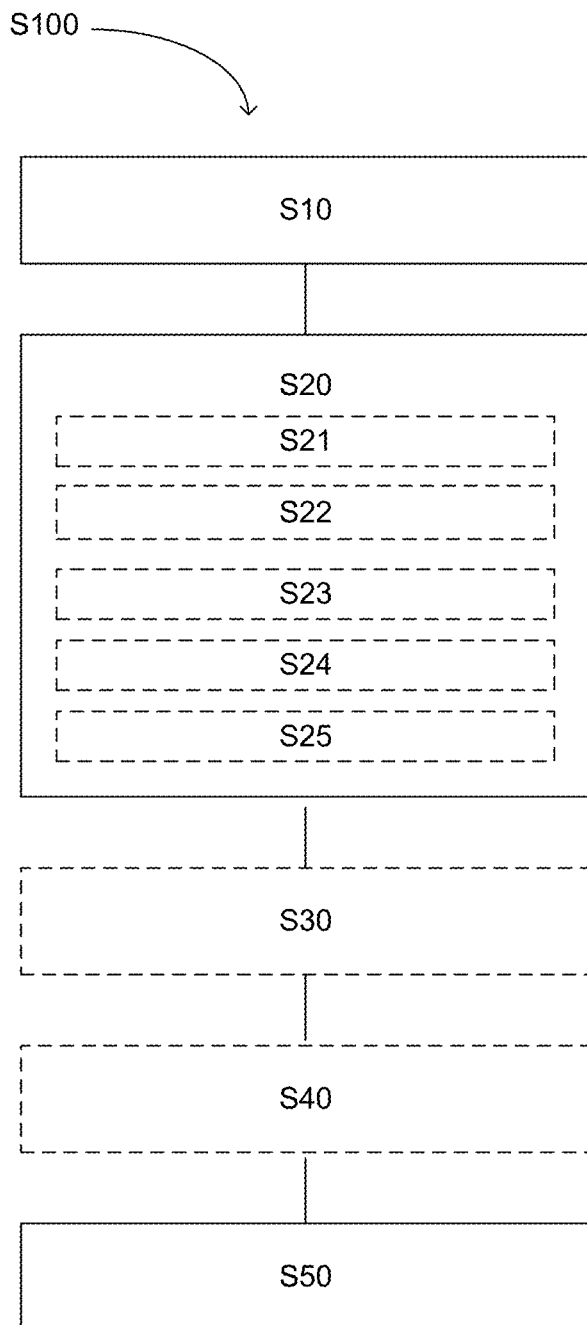
FIG. 4 shows a simplified block diagram for dynamic speech equalization according to the present disclosure.

FIG. 4 shows a method S100 for dynamic speech equalization comprising the steps of receiving S10 an acoustic input signal 12, processing S20 said acoustic input signal by using a dynamic speech equalization function 100 for enhancing speech intelligibility comprising at least an actuator part 110. The method further includes transmitting S30 an output signal 13 based on said processed input signal.

The processing further comprises steps of dynamically applying S21 a compensation filter 111 to the received acoustic input signal and dynamically applying S22 a transparent filter 112 to the received input signal.

Figure 5A:
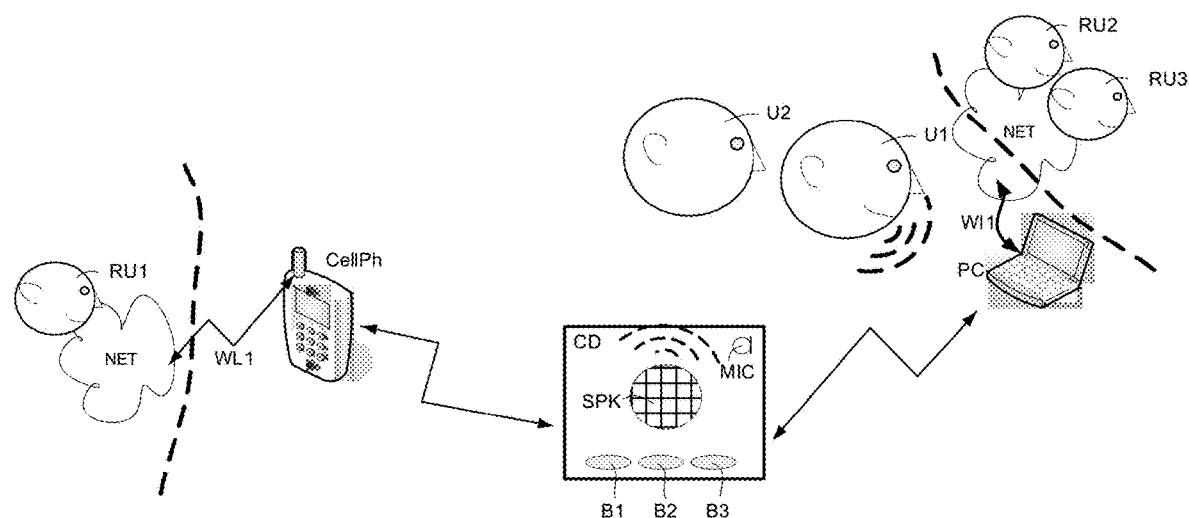
FIG. 5*a-b* shows two applications of a speakerphone or a headset comprising a loudspeaker system according to the present disclosure.

FIG. 5a shows a communication device CD (e.g. a speakerphone) comprising two wired or wireless audio interfaces to other devices, a) a wireless telephone (CellPh, e.g. a cellphone, e.g. a Smartphone, FIG. 5a) or a one-way audio delivery device (Music player in FIG. 5b), and b) a computer (PC, e.g. a PC). The audio interface to the computer (PC) maybe wireless or a wired, e.g. an USB (audio) interface including a cable and an USB-connector, for connecting the communication device to the computer and allowing two-way audio to be exchanged between the communication device CD and the computer. The audio interface to the wireless telephone (CellPh) may comprise a cable and a phone connector (PhCon) for directly connecting the communication device to the computer and allowing two-way audio to be exchanged between the communication device and the computer. The communication device (CD) comprises a number of activation elements (B1, B2, B3), e.g. push buttons (or alternatively a touch sensitive display) allowing the control of functions of the communication device and/or devices connected to the communication device. One of the activation elements (e.g. B1) may be configured to allow connection (hook-off, answer call) and/or dis-connection (hook-on, terminate call) of the wireless telephone (CellPh) connected to the communication device. One of the activation elements (e.g. B2) may be configured to allow a user to control the volume of the loudspeaker output. One of the activation elements (e.g. B3) may be configured to allow a user to control a mode of operation of the loudspeaker system of the communication device.

The scenario shown in FIG. 5a illustrates a teleconference between users (U1, U2) in the vicinity of the communication device (CD) and users (RU1, RU2, and RU3) at two (different) remote locations. Remote user RU1 is connected to the communication device (CD) via wireless telephone (CellPh) and wireless connection WL1 to a network (NET). Remote users RU2, RU3 are connected to the communication device (CD) via computer (PC) and wired connection WI1 to a network (NET).

Figure 5B:
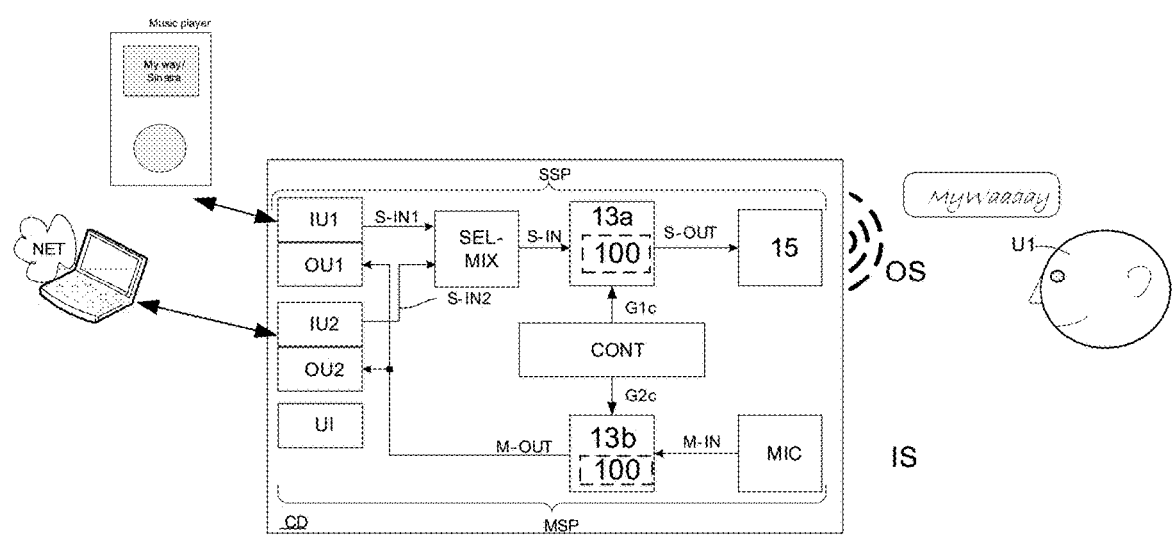

FIG. 5b illustrates a different scenario than FIG. 5a. FIG. 5b illustrates the reception (and optional mixing) of audio signals from the various audio delivery devices (Music player and PC) connected to the communication device (CD). The communication device (CD) comprises two (two-way) audio interfaces embodied in I/O units IU1/OU1 and IU2/OU2, respectively.

The communication device of FIG. 5b comprises a loudspeaker signal path (SSP), a microphone signal path (MSP), and a control unit (CONT) for dynamically controlling signal processing of the two signal paths. The loudspeaker signal path (SSP) comprises receiver units (IU1, IU2) for receiving an electric signal from a connected device and providing it as an electric received input signal (S-IN1, S-IN2), an SSP-signal processing unit 13a for processing (including dynamic speech equalization) the electric received input signal (S-IN1, S-IN2) and providing a processed output signal (S-OUT), and a loudspeaker unit 15 operationally connected to each other and configured to convert the processed output signal (S-OUT) to an acoustic sound signal (OS) originating from the signal received by the receiver unit (IU1, IU2). The loudspeaker signal path (SSP) further comprises a selector-mixing unit (SEL-MIX) for selecting one of the two inputs audio signals (or mixing them) and providing a resulting signal S-IN to the SSP-signal processing unit 13a. The microphone signal path (MSP) comprises a microphone unit (MIC) for converting an acoustic input sound (IS) to an electric microphone input signal (M-IN), an MSP-signal processing unit (13b) for processing the electric microphone input signal (M-IN) and providing a processed output signal (M-OUT), and respective transmitter units (OU1, OU2) operationally connected to each other and configured to transmit the processed signal (M-OUT) originating from an input sound (IS) picked up by the microphone unit (MIC) to the connected device. The control unit (CONT) is configured to dynamically control the processing of the SSP- and MSP-signal processing units (13a and 13b, respectively), including mode selection, and equalization in the SSP path.

The loudspeaker signal path (SSP) is divided in two (IU1, IU2) for receiving input signals from the respective audio devices (Music player and PC). Likewise, the microphone signal path (MSP) is divided in two (OU1, OU2) for transmitting output signals to the respective audio devices (Music player (not relevant) and PC). One-way and two-way audio connections between the communication device (units IU1, IU2 and OU1, OU2) and two the audio devices (here Music player and PC) can be established via wired or wireless connections, respectively.

Figure 6:
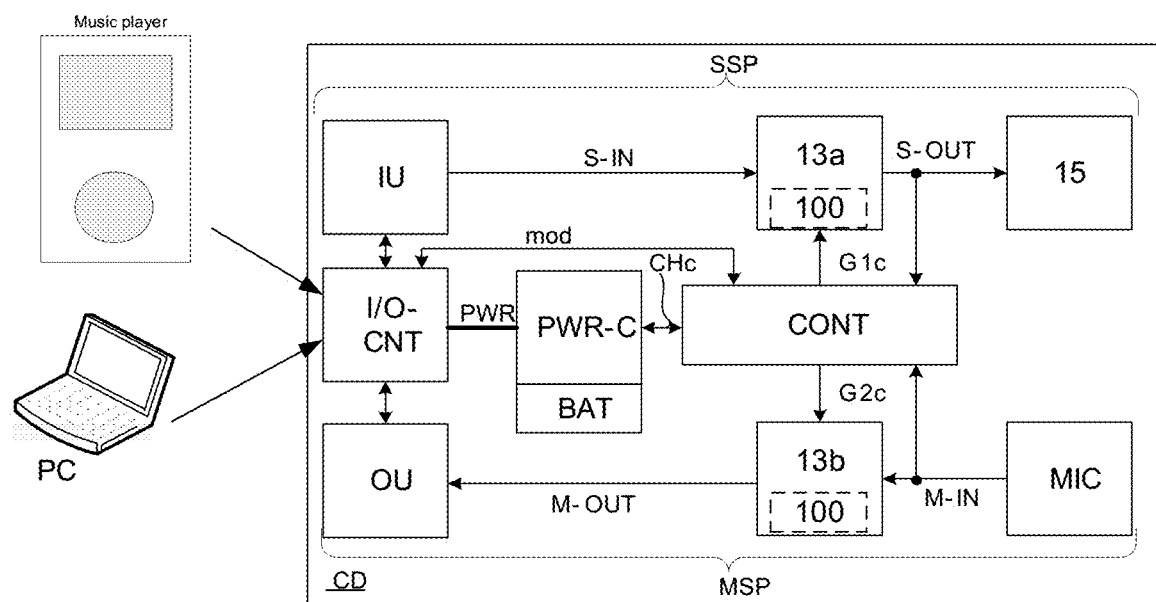
FIG. 6 shows a speakerphone or a headset comprising a loudspeaker system according to the present disclosure.

FIG. 6 shows a communication device CD (here a speakerphone or a headset) comprising a loudspeaker system according to the present disclosure. The unit and functionality are identical to the one described in connection with FIG. 5a-b and may thus represent a relevant mode of operation, where the dynamic speech dependent equalization according to the present disclosure is advantageously applied.

In FIG. 6, the audio interfaces are included in I/O control unit I/O-CNT, which receives input signals from the devices connected to the respective audio interfaces and transmit an output signal to the connected devices, if relevant. In a listening mode, where music or other broadband audio signals are received from one or both audio delivery devices (Music player, and PC), it is assumed that, no audio signal is transmitted from the communication device (CD) to the connected audio delivery devices. The listening mode may hence be equal to the previously discussed mode. The I/O control unit I/O-CNT, is connected to power control unit PWR-C and a battery BAT. The power control unit PWR-C receives signal PWR from the I/O control unit I/O-CNT enabling a detection of a possible power supply signal from the audio interface and—if such power supply is present—to initiate a recharging of a rechargeable battery (BAT), if relevant. It further provides control signal CHc to the control unit indicating whether the current power supply is based on a remote source (e.g. received via the audio interface or via a mains supply) or whether the local energy source (BAT) is currently used. Such information can be used in the control unit CONT to decide on an appropriate mode of operation in general, but also regarding the dynamic speech dependent equalization. A specific set of speech dependent equalization functions for a battery mode and for an external power supply mode may be defined and the appropriate sets of parameters for implementing the respective equalization functions may be stored in the communication device.

Figure 7:
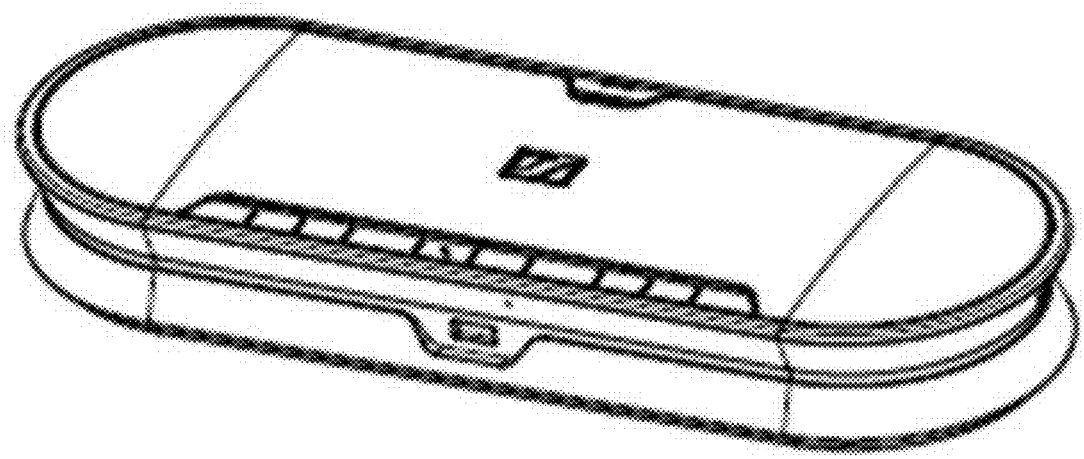
FIG. 7 shows cross-sections of a speakerphone that may advantageously include a loudspeaker system according to the present disclosure.

FIG. 7 shows a speaker phone (CD) that may advantageously include a loudspeaker system according to the present disclosure. The speaker phone comprises a centrally located loudspeaker unit, not shown. The speakerphone (CD) further comprises a user interface UI, not shown, in the form of a centrally located activation element (push button), e.g. for changing a mode of operation of the device (or for activating an on or an off state, etc.).

It is intended that the structural features of the devices described above, either in the detailed description and/or in the claims, may be combined with steps of the method, when appropriately substituted by a corresponding process.

As used, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that when an element is referred to as being "connected" or "coupled" to another element, it can be directly connected or coupled to the other element, but an intervening element may also be present, unless expressly stated otherwise. Furthermore, "connected" or "coupled" as used herein may include wirelessly connected or coupled. As used herein, the term "and/or" includes any and all combinations of one or more of the associated listed items. The steps of any disclosed method are not limited to the exact order stated herein, unless expressly stated otherwise.

It should be appreciated that reference throughout this specification to "one embodiment" or "an embodiment" or "an aspect" or features included as "may" means that a particular feature, structure or characteristic described in connection with the embodiment is included in at least one embodiment of the disclosure. Furthermore, the particular features, structures or characteristics may be combined as suitable in one or more embodiments of the disclosure. The previous description is provided to enable any person skilled in the art to practice the various aspects described herein. Various modifications to these aspects will be readily apparent to those skilled in the art, and the generic principles defined herein may be applied to other aspects.

The claims are not intended to be limited to the aspects shown herein but are to be accorded the full scope consistent with the language of the claims, wherein reference to an element in the singular is not intended to mean "one and only one" unless specifically so stated, but rather "one or more." Unless specifically stated otherwise, the term "some" refers to one or more.

Accordingly, the scope should be judged in terms of the claims that follow.

The invention claimed is:

1. A method for dynamic speech equalization, comprising:
receiving an input audio signal;
analyzing a characteristic of an input sample of the input audio signal relative to speech by applying two analysis filters in parallel to the input audio signal, and measuring an energy level of the output of each of the two filters, the two analysis filters having different frequency ranges, wherein one of the two analysis filters is a high pass filter with a cut-off frequency in the range of 1500 to 2500 Hz, and the other of the two analysis filters is a low pass filter with a cut-off frequency in the range of 400 to 600 Hz;
utilizing at least one actuator filter, which receives the input audio signal in parallel with the two analysis filters, to apply a frequency adjustment on the same input sample of the input audio signal whose characteristic is being analyzed by application of the two analysis filters to produce an equalized electric audio signal, the frequency adjustment being dependent on the analyzed characteristic; and
transmitting an output signal perceivable by a user as sound representative of said equalized audio signal or a processed version thereof.

2. The method according to claim 1,
wherein the utilizing at least one actuator filter to apply the frequency adjustment includes:

applying a first actuator filter to the received input sample of the input audio signal to provide a first output signal, and applying a second actuator filter to the received input sample of the input audio signal to provide a second output signal; and wherein the equalized electric audio signal is provided by mixing the first output signal and the second output signal according to weights determined in accordance with the measured energy levels of the respective two analysis filters.

3. The method according to claim 2, wherein the method further comprises continuously updating the respective weights by which the first and second output signals are mixed.

4. The method according to claim 2, wherein the weights are determined such that:

a higher weight is applied to the first output signal in response to the analyzed characteristic of the input audio signal indicating a speech passage of high quality; and a higher weight is applied to the second output signal in response to the analyzed characteristic of the input audio signal indicating a speech passage of low quality.

5. The method according to claim 4, wherein the weights are determined such that substantially equal weights are applied to the first and second output signals in response to the analyzed characteristic of the input audio signal indicating a speech passage of medium quality.

6. The method according to claim 2, further comprising applying a mapping function for updating the weights for each received input audio signal.

7. The method according to claim 1, wherein the first actuator filter is a compensation filter, and wherein the second actuator filter is a transparent filter.

8. The method according to claim 7, wherein the compensation filter applies compensation for a worst case impaired signal, and wherein the transparent filter applies compensations for a best case impaired signal.

9. The method according to claim 1, wherein the input audio signal received by the at least one actuator filter is the same input audio signal analyzed by the two analysis filters.

10. A speakerphone comprising an audio interface to at least one of a microphone, a data communication channel, and a phone connection, the audio interface receiving an input audio signal with a first dynamic range of levels representative of a time and frequency variant sound signal, the input audio signal comprising a target signal and/or a noise signal and providing an electric audio input signal;

a processor;

a memory storing computer instructions which, when executed, cause the processor to perform a process comprising modifying said input audio signal in dependence on frequency and for providing an equalized electric audio signal according to an equalization function, wherein the equalization function comprises:

analyzing a characteristic of an input sample of the input audio signal relative to speech by applying two analysis filters in parallel to the input audio signal, and measuring an energy level of the output of each of the two filters, the two analysis filters having different frequency ranges, wherein one of the two analysis filters is a high pass filter with a cut-off frequency in the range of 1500 to 2500 Hz, and the other of the two analysis filters is a low pass filter with a cut-off frequency in the range of 400 to 600 Hz, and utilizing at least one actuator filter, which receives the input audio signal in parallel with the two analysis filters, to apply a frequency adjustment on the same input sample of the input audio signal whose characteristic is being analyzed by application of the two analysis filters to produce an equalized electric audio signal, the frequency adjustment being dependent on the analyzed characteristic; and a loudspeaker for providing an output signal perceivable by a user as sound representative of said equalized electric audio signal or a processed version thereof.

11. The speakerphone according to claim 10, wherein the equalization function applies the frequency adjustment by:

applying a first actuator filter to the input sample of the received input audio signal to provide a first output signal, and applying a second actuator filter to the input sample of the received input audio signal to provide a second output signal; and wherein the equalized electric audio signal is provided by mixing the first output signal and the second output signal according to weights determined in accordance with the measured energy levels of the respective two analysis filters.

12. The speakerphone according to claim 11, wherein the equalization function continuously updating the respective weights by which the first and second output signals are mixed.

13. The speakerphone according to claim 11, wherein the equalization function determines the weights such that:

a higher weight is applied to the first output signal in response to the analyzed characteristic of the input audio signal indicating a speech passage of high quality; and a higher weight is applied to the second output signal in response to the analyzed characteristic of the input audio signal indicating a speech passage of low quality.

14. The speakerphone according to claim 13, wherein the equalization function determines the weights such that substantially equal weights are applied to the first and second output signals in response to the analyzed characteristic of the input audio signal indicating a speech passage of medium quality.

15. The speakerphone according to claim 11, wherein the equalization function further comprises applying a mapping function for updating the weights for each received input audio signal.

16. The speakerphone according to claim 10, wherein the first actuator filter is a compensation filter, and wherein the second actuator filter is a transparent filter.

17. The speakerphone according to claim 16, wherein the compensation filter applies compensation for a worst case impaired signal, and wherein the transparent filter applies compensations for a best case impaired signal.

18. The speakerphone according to claim 10, wherein the input audio signal received by the at least one actuator filter is the same input audio signal analyzed by the two analysis filters.

19. A hearing device comprising an audio interface to at least one of a microphone, a data communication channel, and a phone connection, the audio interface receiving an input audio signal with a first dynamic range of levels representative of a time and frequency variant sound signal, the input audio signal comprising a target signal and/or a noise signal and providing an electric audio input signal;

a processor;

a memory storing computer instructions which, when executed, cause the processor to perform a process comprising modifying said input audio signal in dependence on frequency and for providing an equalized electric audio signal according to an equalization function, wherein the equalization function comprises:

analyzing a characteristic of an input sample of the input audio signal relative to speech by applying two analysis filters in parallel to the input audio signal, and measuring an energy level of the output of each of the two filters, the two analysis filters having different frequency ranges, wherein one of the two analysis filters is a high pass filter with a cut-off frequency in the range of 1500 to 2500 Hz, and the other of the two analysis filters is a low pass filter with a cut-off frequency in the range of 400 to 600 Hz, and utilizing at least one actuator filter, which receives the input audio signal in parallel with the two analysis filters, to apply a frequency adjustment on the same input sample of the input audio signal whose characteristic is being analyzed by application of the two analysis filters to produce an equalized electric audio signal, the frequency adjustment being dependent on the analyzed characteristic, and a loudspeaker for providing an output signal perceivable by a user as sound representative of said equalized electric audio signal or a processed version thereof.

20. A hearing device according to claim 19, wherein the hearing device is a headset.

21. The hearing device according to claim 19, wherein the input audio signal received by the at least one actuator filter is the same input audio signal analyzed by the two analysis filters.

* * * * *